(12) United States Patent
Lu

(10) Patent No.: US 6,603,420 B1
(45) Date of Patent: Aug. 5, 2003

(54) REMOTE CONTROL DEVICE WITH MOTION-BASED CONTROL OF RECEIVER VOLUME, CHANNEL SELECTION OR OTHER PARAMETERS

(75) Inventor: Jin Lu, Croton-on-Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/453,424

(22) Filed: Dec. 2, 1999

(51) Int. Cl.[7] ............................................. G08C 19/12
(52) U.S. Cl. ....................... 341/176; 341/173; 702/150; 345/158
(58) Field of Search ................................ 345/156, 157, 345/158, 159; 341/173, 176; 702/150; 338/47

(56) References Cited

U.S. PATENT DOCUMENTS

| | | | |
|---|---|---|---|
| 4,745,402 A | | 5/1988 | Auerbach ................... 340/709 |
| 4,796,019 A | | 1/1989 | Auerbach ................... 340/709 |
| 5,302,936 A | * | 4/1994 | Yaniger ...................... 252/502 |
| 5,453,758 A | | 9/1995 | Sato ............................ 345/158 |
| 5,541,570 A | * | 7/1996 | McDowell ................. 252/513 |
| 5,598,187 A | | 1/1997 | Ide et al. ..................... 345/158 |
| 5,608,389 A | * | 3/1997 | Matsuzawa ............ 340/825.56 |
| 5,644,126 A | | 7/1997 | Ogawa .................... 250/231.1 |
| 5,703,623 A | | 12/1997 | Hall et al. ................... 345/158 |
| 5,758,267 A | * | 5/1998 | Pinder et al. ................. 341/20 |
| 5,778,256 A | | 7/1998 | Darbee ....................... 341/176 |
| 5,874,941 A | | 2/1999 | Yamada ...................... 345/157 |
| 6,115,028 A | | 9/2000 | Balakrishnan et al. ...... 345/157 |
| 6,346,891 B1 | * | 2/2002 | Feinleib et al. ............. 340/432 |
| 6,347,290 B1 | * | 2/2002 | Bartlett ....................... 345/863 |

FOREIGN PATENT DOCUMENTS

| | | | |
|---|---|---|---|
| EP | 0377055 | 12/1988 | ............ G08C/23/00 |
| EP | 0357909 | 7/1989 | ............ G08C/23/00 |
| EP | 0869451 | 9/1997 | ............ G06K/11/08 |
| EP | 0942391 A2 | 9/1999 | ............ G06K/11/18 |
| GB | 2284478 | 11/1994 | ............ G01S/3/782 |
| GB | 2291497 | 6/1995 | ............ G01S/3/782 |
| GB | 2295707 | 11/1995 | ............ G08C/23/04 |
| WO | 9307602 | 9/1992 | ............ G08C/23/00 |
| WO | 9502163 | 7/1994 | ............ G01B/11/26 |
| WO | WO0103054 | 1/2001 | ............ G06F/15/02 |

\* cited by examiner

*Primary Examiner*—Michael Horabik
*Assistant Examiner*—Albert K. Wong
(74) *Attorney, Agent, or Firm*—Gregory L. Thorne

(57) ABSTRACT

A remote control device includes a motion detection circuit operative to generate signals indicative of a direction of movement of the device. A processor receives the signals from the motion detection circuit and generates corresponding control signals suitable for transmission to a receiver. A user is thereby able to indicate entry of particular commands by moving the remote control device in a certain way. For example, movement of the remote control device in a particular direction in a first plane may correspond to an up command for a first controlled parameter, e.g., receiver volume, while movement of the remote control device in an opposite direction in the first plane corresponds to a down command for the first controlled parameter. Similarly, movement of the remote control in a particular direction in a second plane perpendicular to the first plane may correspond to an up command for a second controlled parameter, e.g., channel selection, while movement of the remote control device in an opposite direction in the second plane corresponds to a down command for the second controlled parameter.

20 Claims, 4 Drawing Sheets

REMOTE CONTROL DEVICE WITH MOTION-BASED CONTROL OF RECEIVER VOLUME, CHANNEL SELECTION OR OTHER PARAMETERS

FIELD OF THE INVENTION

The present invention relates generally to remote control devices for use in controlling the operation of televisions, videocassette recorders, stereo systems or other types of consumer electronic equipment, and more particularly to techniques for generating device orientation information using such remote control devices.

BACKGROUND OF THE INVENTION

Remote control devices are commonly used to control televisions and other types of consumer electronics equipment. It is generally desirable that the remote control device be configured in such a manner that it provides efficient user control of equipment parameters such as volume level, channel selection, etc. However, conventional remote control devices are deficient in this respect. For example, although the most commonly-used functions on a typical television remote control are volume control and channel selection, a user nonetheless has to depress a button each and every time an adjustment in one of these parameters is needed. As a result, a user may be constantly depressing the buttons for these functions, which is not only a source of inconvenience and annoyance for the user, but can also lead to repetitive stress injury.

In addition, it is often difficult for a user to locate the appropriate command buttons, particularly in a darkened room or other poorly-lighted environment. Although conventional remotes use certain button shapes to distinguish different types of controls, e.g., up and down arrow button shapes for volume or channel up and down commands, respectively, a user still must exert some effort to locate the appropriate buttons, and there remains an unacceptably high likelihood that the wrong function may be inadvertently executed.

A number of conventional techniques exist for detecting the orientation of a remote control device. Such techniques allow a user to alter the orientation of the device in order, e.g., to control the position of a cursor on a corresponding television display. Examples of such techniques are described in U.S. Pat. Nos. 4,745,402 and 4,796,019, and in U.K. Patent Application No. GB/2,295,707. These techniques generally detect the orientation of the remote control device by processing in a corresponding receiver infrared signals received from multiple light-emitting diodes (LEDs) mounted on the device. The amplitude and phase of the received infrared signals are indicative of the orientation of the remote control device.

Unfortunately, these and other conventional techniques fail to provide an acceptable solution to the above-noted problems associated with manual button control of commonly-used remote control functions.

A need therefore exists for improved remote control devices which are capable of generating commands or other information in a manner which is more convenient for the user.

SUMMARY OF THE INVENTION

The invention provides an improved remote control device in which a direction of device movement is detected within the device and utilized to determine entry of a particular command for a function such as volume control or channel selection. In accordance with the invention, a remote control device includes a motion detection circuit operative to generate signals indicative of a direction of movement of the remote control device. A processor receives the signals from the motion detection circuit and generates corresponding control signals suitable for transmission to a receiver. A user is thereby able to indicate entry of particular commands by moving the remote control device in a certain way.

In an illustrative embodiment of the invention, movement of the remote control device in a particular direction in a first plane may correspond to an up command for a first controlled parameter, e.g., receiver volume, while movement of the remote control device in an opposite direction in the first plane corresponds to a down command for the first controlled parameter. Similarly, movement of the remote control in a particular direction in a second plane perpendicular to the first plane may correspond to an up command for a second controlled parameter, e.g., channel selection, while movement of the remote control device in an opposite direction in the second plane corresponds to a down command for the second controlled parameter.

In accordance with the invention, the motion detection circuit may comprise a plurality of stress-sensitive resistive elements, each corresponding to a particular direction of potential movement of the remote control device, and each providing a detectable indication of a position of the remote control device with respect to its corresponding direction. For example, the motion detection circuit may include a set of four of the stress-sensitive resistive elements, with each of the four stress-sensitive resistive elements arranged on a particular side of a ball-shaped weight supported therebetween, such that varying the position of the remote control device causes different amounts of stress to be applied to at least a subset of the stress-sensitive resistive elements. Associated with each of the stress-sensitive resistive elements is a meter or other measuring device operative to measure, e.g., a current through the corresponding resistive element, or other type of signal indicative of a direction of movement of the remote control device.

Advantageously, the invention allows a user to enter commands for commonly-used functions such as volume control and channel selection without the need for manual button depression. As a result, the invention eliminates the previously-described problems of button location and potential repetitive stress injury, and also provides a more efficient and natural manner for a user to interact with the controlled equipment. These and other features and advantages of the present invention will become more apparent from the accompanying drawings and the following detailed description.

DETAILED DESCRIPTION OF THE INVENTION

Figure 1:
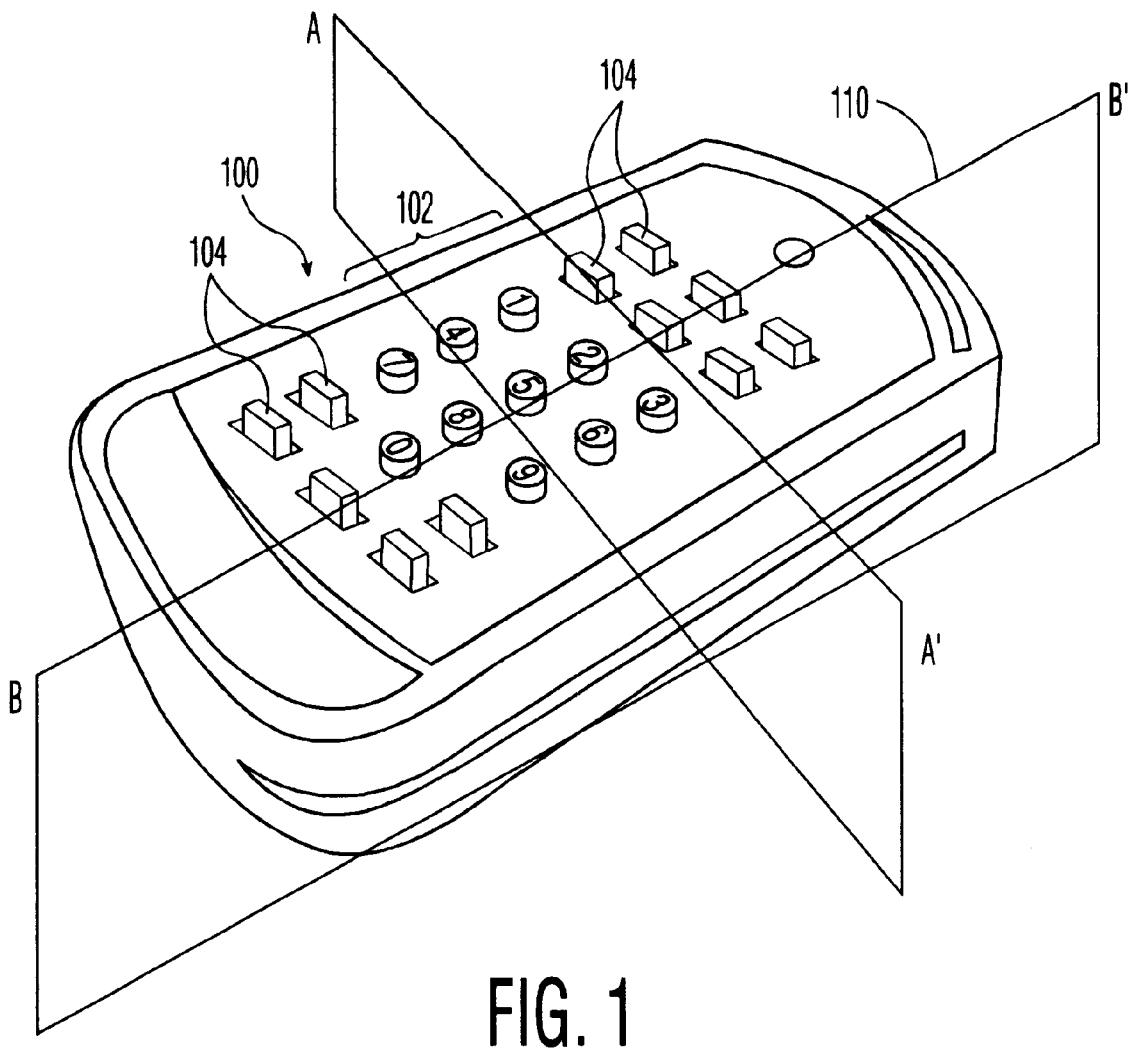
FIG. 1 shows an illustrative embodiment of a remote control device in accordance with the invention.

FIG. 1 shows an example of a remote control device 100 which includes a capability for generating motion-based commands or other signals in accordance with the invention. The remote control device 100 includes a numerical keypad 102 as well as a number of additional buttons 104 located above and below the keypad 102. It should be noted that the particular number and arrangement of buttons, and the general configuration and external appearance of the device 100, are by way of example only. The remote control device 100, although not requiring any specific physical configuration, generally includes at least a processor and a memory, and may include other types and arrangements of conventional processing elements.

There are two planes identified in FIG. 1 with respect to the remote control device 100, i.e., an A-A' plane and a B-B' plane. The A-A' plane is perpendicular to a pointing direction of the remote control device 100, i.e., perpendicular to a direction in which a front end 110 of device 100 is pointed toward a television or other piece of equipment controlled by device 100. The B-B' plane is perpendicular to A-A' plane, i.e., parallel to the pointing direction of the remote control device 100. A user holding the remote control device 100 can, e.g., rotate the device 100 to the right or the left in the A-A' plane by "rolling" his/her wrist clockwise or counter-clockwise, respectively, and rotate the device 100 in the B-B' plane by moving the front end 110 of the device 100 in an upward or downward direction, e.g., without "rolling" the wrist.

In accordance with the invention, the remote control device 100 is configured to detect direction of movement relative to the above-described A-A' and B-B' planes, e.g., up, down, right, and left directions of movement. Advantageously, the motion detection circuitry may be implemented within the remote device itself, rather than in a corresponding receiver.

Figure 2:
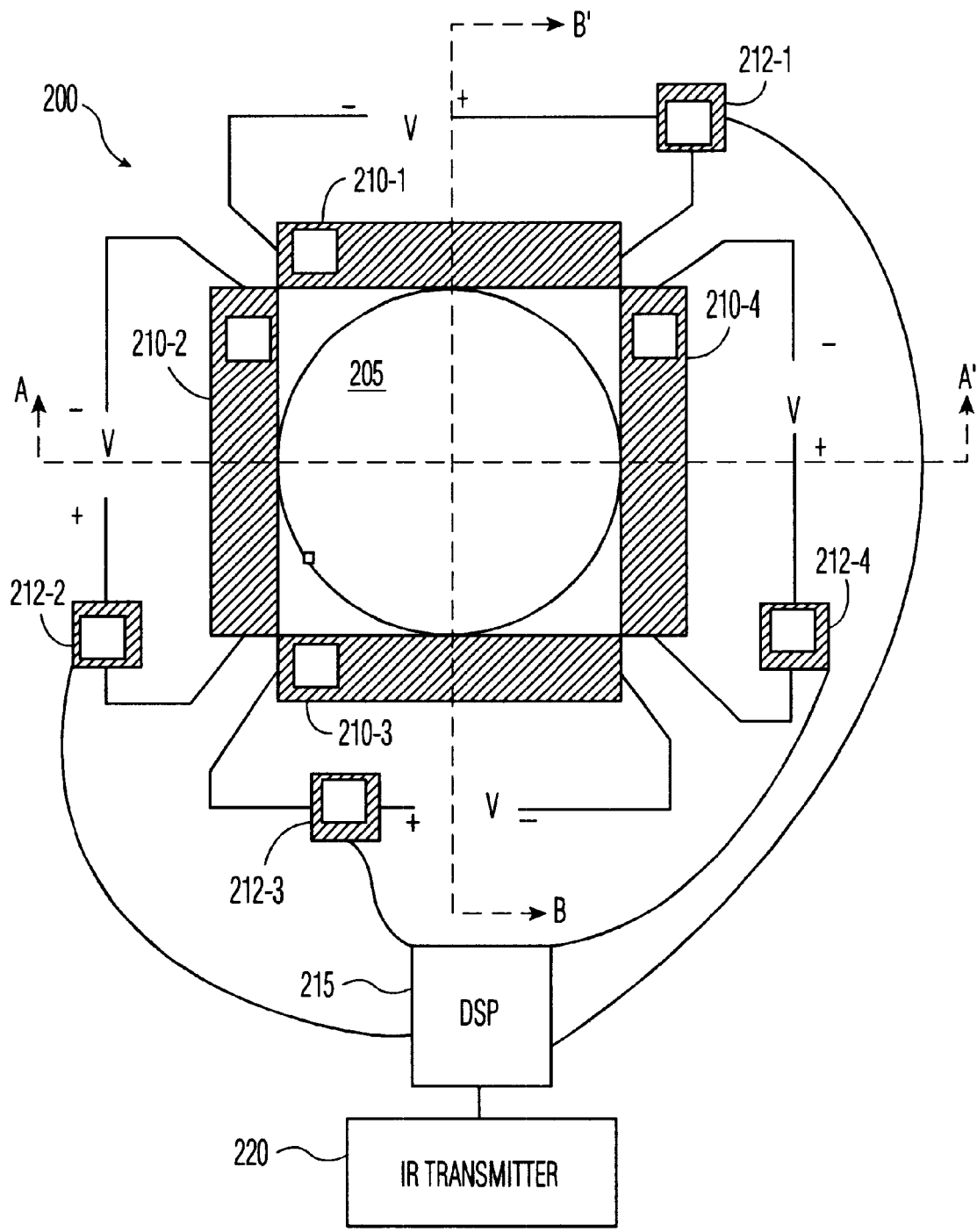
FIG. 2 shows an illustrative embodiment of a set of motion detection circuitry for use in the remote control device of FIG. 1.

FIG. 2 shows an exemplary set of motion detection circuitry 200 which is implemented in the remote control device 100 of FIG. 1. The motion detection circuitry 200 is operative to determine a direction of movement of the remote control device 100. The circuitry measures two angles which result from the above-described movement in the A-A' and B-B' planes, using a ball-shaped weight 205 which contacts each of a plurality of stress-sensitive resistive elements 210-1, 210-2, 210-3 and 210-4. Each of the stress-sensitive resistive elements 210-i, i=1, ... 4, changes its resistance in accordance with the magnitude of the force or stress applied thereto by the ball-shaped weight 205. As will be described in conjunction with FIGS. 3A, 3B, 4A and 4B below, this applied stress varies in a predictable way as a function of the orientation of the remote control device 100, and can therefore be used to detect directions of movement of the device.

Associated with the stress-sensitive resistive elements 210-1, 210-2, 210-3 and 210-4 in the motion detection circuitry 200 of FIG. 2 are corresponding meters 212-1, 212-2, 212-3 and 212-4, respectively. A common voltage source V is applied to each of the resistive elements 210-i. Each of the meters 212-i measures the electric current that flows through the corresponding one of the four resistive elements 210-i. When the resistances of the stress-sensitive resistive elements 210-i change, in response to movement of the remote control device 100, the electric currents measured by the meters 212-i will also change.

These measurements are supplied by the meters 212-i to a digital signal processor (DSP) 215, which samples and processes the measurements to determine if a particular predetermined command has been entered by a user moving the remote control device 100 in a specified way. There is a linear relationship between the samples at the DSP 215 and the stresses applied to the resistive elements 210-i. Typically, at most two of the stress-sensitive resistive elements 210-i are under stress at any given moment, such that the DSP 215 need only determine two sets of differential measurements. Since the stress on a given resistive element is a function of the angles of the remote control device movement, these differential measurements are also functions of the angles.

The output of the DSP 215, which may be representative of a particular command as determined in accordance with the above-noted measurements, is directed to an infrared (IR) transmitter 220 which modulates it onto an appropriate IR carrier for transmission to a corresponding receiver. The receiver, which is not shown, may be configured in a conventional manner to convert signals received from the IR transmitter to appropriate control signals.

The DSP 215 may be configured so as to output a particular command identifier only if the difference between two consecutive sampled measurements exceeds a certain threshold. Since the DSP 215 can also detect which of the four resistive elements 210-i generates the threshold-exceeding differential measurements, the differential measurement capability may be used for indicating entry of channel-up, channel-down, volume-up, and volume-down commands by a user moving the remote control device 100 in a particular way. For example, if the user "rolls" the remote control device clockwise in the A-A' plane, i.e., to the right, with sufficient speed, the differential measurements of the corresponding electric currents can exceed the threshold, thereby indicating that a volume-up command has been requested.

Similarly, if the user "rolls" the remote control device 100 in a counter-clockwise direction in the A-A' plane, i.e., to the left, with sufficient speed, a volume-down command is indicated. In addition, moving the remote control device 100 upward or downward in the B-B' plane with sufficient speed may be used to indicate a channel-up command or channel-down command, respectively.

Figure 3A:
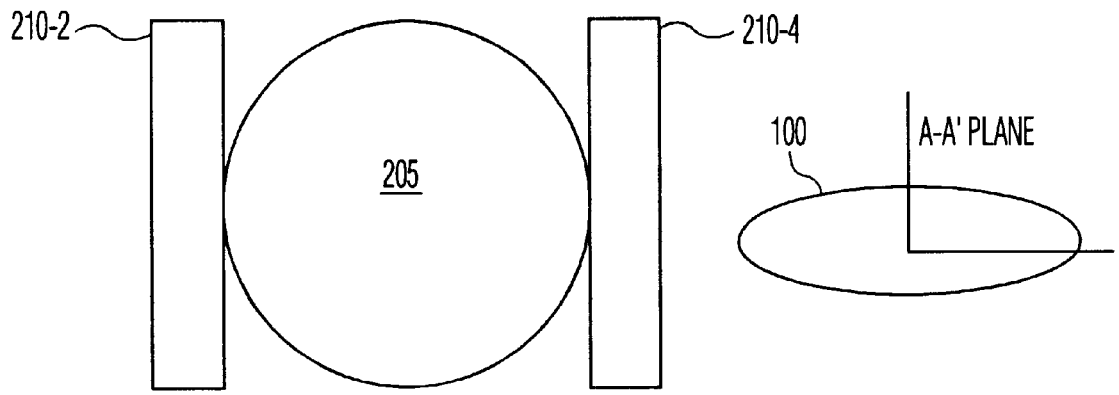
FIGS. 3A and 3B illustrate the manner in which motion information is generated in the detection circuitry of FIG. 2 for motion along the A-A' plane shown in FIGS. 1 and 2.
Figure 3B:
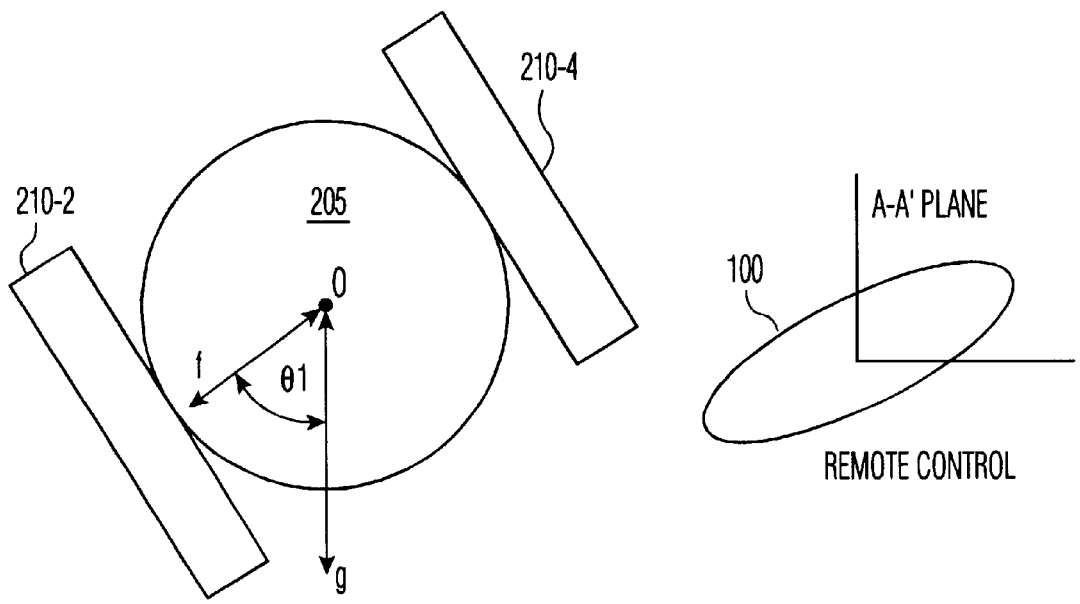

FIGS. 3A and 3B illustrate the manner in which motion in the A-A' plane results in a detectable change in the stress applied to one of the stress-sensitive resistive elements 210-2 or 210-4. In FIG. 3A, the remote control device 100 is positioned as shown in FIG. 1, with no clockwise or counter-clockwise motion in the A-A' plane. In this situation, there is substantially no stress applied by the ball-shaped weight 205 to the resistive elements 210-2 and 210-4.

FIG. 3B shows a situation in which the user has "rolled" the remote control device 100 in a counter-clockwise direction in the A-A' plane. In this situation, there is a corresponding change in an angle $\theta 1$ between a gravitational force g and a normal to the surface of the resistive element 210-2, referenced to a center point 0 of the weight 205. A force f applied by the weight 205 to resistive element 210-2 along the normal also changes as a function of the angle $\theta 1$. This change in applied force in turn causes the current flowing through the resistive element 210-2 to change, and this current change is detected by DSP 215 when it samples the output of the corresponding meter 212-2. The other stress-sensitive resistive element 210-4 remains substantially free of applied stress, since it is "on top" of the ball-shaped weight 205 in this situation. In a like manner, rotation in a clockwise direction results in a similar application of force to the resistive element 210-4, with the resistive element 210-2 remaining substantially stress-free.

The FIG. 2 arrangement of resistive elements 210-2 and 210-4 thus provides capability for detecting user entry of two distinct commands via respective counter-clockwise and clockwise motion of the remote control device 100. These commands may be, e.g. volume up and down commands, channel up and down commands, or other suitable commonly-used commands associated with the remote control device 100.

Figure 4A:
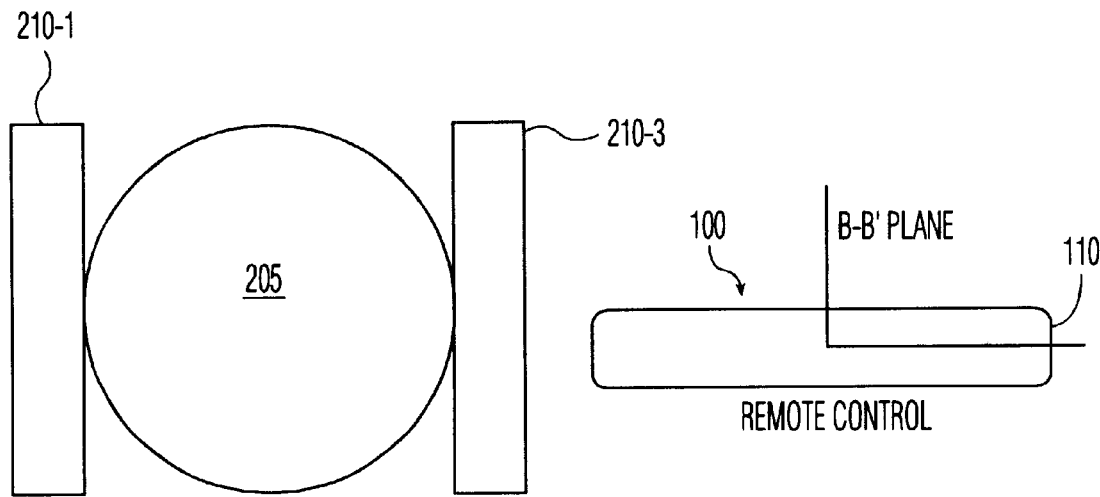
FIGS. 4A and 4B illustrate the manner in which motion information is generated in the detection circuitry of FIG. 2 for motion along the B-B' plane shown in FIGS. 1 and 2.
Figure 4B:
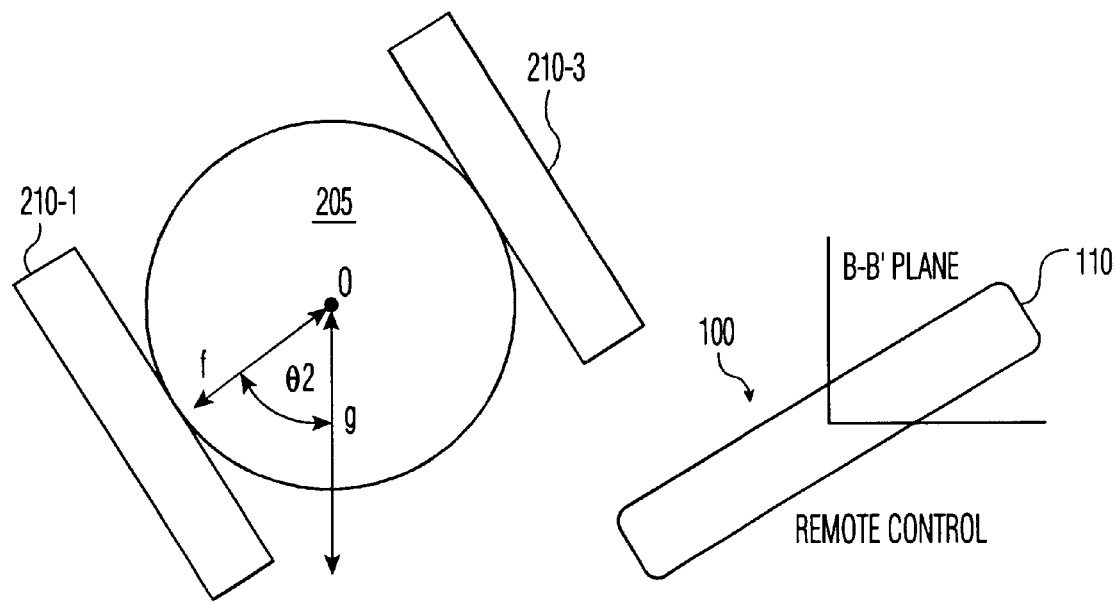

FIGS. 4A and 4B illustrate the manner in which motion in the B-B' plane results in a detectable change in the stress applied to one of the stress-sensitive resistive elements 210-1 or 210-3. In FIG. 4A, the remote control device 100 is positioned as shown in FIG. 1, with no clockwise or counter-clockwise rotation in the B-B' plane. In this situation, there is substantially no stress applied by the ball-shaped weight 205 to the resistive elements 210-1 and 210-3.

FIG. 4B shows a situation in which the user has moved the front end 110 of the remote control device 100 in an upward direction in the B-B' plane. In this situation, there is a corresponding change in an angle θ2 between the gravitational force g and a normal to the surface of the resistive element 210-1. A force f applied by the weight 205 to resistive element 210-1 along the normal also changes as a function of the angle θ2. This change in applied force in turn causes the current flowing through the resistive element 210-1 to change, and this change is detected by DSP 215 when it samples the output of the corresponding meter 212-1. The other stress-sensitive resistive element 210-3 remains substantially free of applied stress, since it is "on top" of the ball-shaped weight 205 in this situation. Movement of the front end 110 in a downward direction results in a similar application of force to the resistive element 210-3, with the resistive element 210-1 remaining substantially stress-free.

The resistive elements 210-1 and 210-3 thus provide capability for user entry of two distinct commands via respective upward and downward motion of the remote control device 100. These commands may be, e.g., volume up and down commands, channel up and down commands, etc. For example, the resistive elements 210-1 and 210-3 may be used to detect motion associated with channel up and down commands, with the previously-described resistive elements 210-2 and 210-4 used to detect motion associated with volume up and down commands.

Although the above-described embodiment uses the DSP 215 to process detected motion to determine a corresponding motion-based command, other embodiments may transmit the detected motion information to the receiver for conversion in the receiver into an appropriate control signal for implementing the command. As another alternative, the receiver can convert the IR signals received from the IR transmitter 220 directly into (x,y) coordinates on a display screen. In this manner, the remote control device 100 as described above can be used for applications such as on-screen cursor control.

The present invention can also be used to "trace" a trajectory of moving (x,y,z) coordinates of the remote control device 100 with respect to a designated reference position of the device. The reference position of the device could be any position before the intended tracing starts. In this case, the above-described motion detection circuitry generates a set of measurements that correspond to the position of the device with respect to the reference position. By sampling the measurements, the DSP 215 obtains a set of signals that represent the (x,y,z) coordinates of the moving remote control device 100. These signals may be sent to the receiver via the transmitter 220 for conversion to coordinates for display on a television or other display screen, or may be further processed in the DSP 215 prior to transmission to the receiver. In any case, if a user "draws" a letter in the air with the remote control device 100, the television screen will be able to reproduce a trajectory of the letter. The DSP 215 or receiver can also be configured to determine how fast the user draws the letter, which is a useful feature for applications such as signature recognition. Other applications of this trajectory recognition capability include utilizing the remote control device as a mouse or for three-dimensional drawing.

The remote control device 100 may be configured to operate in conjunction with any conventional IR receiver, or any other receiver capable of receiving signals from a remote control device. Such receivers are well known in the art, and are therefore not described in detail herein.

The embodiments of the invention described above are intended for purposes of illustration only, and should not be construed as limiting the invention to any particular embodiment or group of embodiments. For example, although particularly well suited for use in conjunction with a digital television (DTV) or other type of television receiver, videocassette recorder, stereo system, etc., the invention can be used in many other remote control applications. In addition, the particular arrangements of device elements shown herein are by way of example, and other embodiments of the invention could utilize other types of devices, e.g., other arrangements of stress-sensitive elements, weights, processors, etc. Parameters other than volume or channel selection can be controlled using a remote control device in accordance with the invention. Moreover, the invention may utilize other types of motion detection mechanisms, including, e.g., gyroscopes and accelerometers. These and numerous other embodiments within the scope of the following claims will be apparent to those skilled in the art.

What is claimed is:

1. A remote control device comprising:

a motion detection circuit operative to generate one or more signals indicative of a direction of movement of the remote control device;

a processor having at least one input coupled to an output of the motion detection circuit, the processor receiving the one or more signals therefrom and generating corresponding control signals for controlling a characteristic of a receiving device, the characteristic including at least one of a volume and a channel selection of the receiving device, the remote control device also being configured for button-actuated control of one or more other characteristics of the receiving device, the control signals being suitable for transmission to the receiving device; and a transmitter coupled to the processor and receiving the control signals therefrom, the transmitter transmitting the control signals to the receiving device.

2. The apparatus of claim 1 wherein the motion detection circuit further comprises a set of four of the stress-sensitive resistive elements, with each of the four stress-sensitive resistive elements arranged on a different side of a weight supported therebetween, such that varying the position of the remote control device causes different amounts of stress to be applied to at least a subset of the stress-sensitive resistive elements.

3. The apparatus of claim 1 wherein the processor processes signals received from the motion detection circuit to determine a corresponding command, and directs the transmitter to send the corresponding command to the receiving device.

4. The apparatus of claim 3 wherein the weight is in the shape of a ball.

5. The apparatus of claim 2 wherein associated with each of the stress-sensitive resistive elements is a meter operative to measure a current through the corresponding resistive element.

6. The apparatus of claim 2 wherein a common voltage is applied to the each of the stress-sensitive resistive elements.

7. The apparatus of claim 2 wherein the processor comprises a digital signal processing device configured to receive as input a plurality of signals, each of the signals representative of an amount of resistance associated with each of the stress-sensitive resistive elements.

8. The apparatus of claim 1 wherein the processor processes signals received from the motion detection circuit to determine a corresponding command, and directs the transmitter to send the corresponding command to a receiver.

9. The apparatus of claim 1 wherein movement of the remote control device in a particular direction in a first plane corresponds to an up command for a first controlled parameter and movement of the remote control in an opposite direction in the first plane corresponds to a down command for the first controlled parameter.

10. The apparatus of claim 9 wherein movement of the remote control in a particular direction in a second plane perpendicular to the first plane corresponds to an up command for a second controlled parameter and movement of the remote control in an opposite direction in the second plane corresponds to a down command for the second controlled parameter.

11. The apparatus of claim 9 wherein the first controlled parameter comprises one of a receiver volume and a receiver channel selection.

12. The apparatus of claim 10 wherein the second controlled parameter comprises one of a receiver volume and a receiver channel selection.

13. The apparatus of claim 1 wherein the transmitter comprises an infrared transmitter operative to transmit a command based on the motion information from the remote control device to the receiving device.

14. The apparatus of claim 1, wherein the control signals correspond to a recognizable character representation.

15. The apparatus of claim 14, wherein the recognizable character representation corresponds to a connected stream of letters representing a signature.

16. A method for generating commands using a remote control device, the method comprising:

generating one or more signals indicative of a detected direction of movement of the remote control device;

generating corresponding control signals for controlling a characteristic of a receiving device, the characteristic including at least one of a volume and a channel selection of the receiving device, the remote control device also being configured for button-actuated control of one or more other characteristics of the receiving device, the control signals being suitable for transmission to the receiving device; and transmitting the control signals to the receiving device.

17. The method of claim 16 wherein movement of the remote control device in a particular direction in a first plane corresponds to an up command for a first controlled parameter and movement of the remote control in an opposite direction in the first plane corresponds to a down command for the first controlled parameter.

18. The method of claim 11 wherein movement of the remote control in a particular direction in a second plane perpendicular to the first plane corresponds to an up command for a second controlled parameter and movement of the remote control in an opposite direction in the second plane corresponds to a down command for the second controlled parameter.

19. The method of claim 17 wherein the first controlled parameter comprises one of a receiver volume and a receiver channel selection.

20. The method of claim 18 wherein the second controlled parameter comprises one of a receiver volume and a receiver channel selection.

* * * * *